United States Patent
Shirakawa et al.

(10) Patent No.: US 9,826,631 B2
(45) Date of Patent: Nov. 21, 2017

(54) REPEATER

(71) Applicant: Hitachi Metals, Ltd., Tokyo (JP)

(72) Inventors: Yohei Shirakawa, Hitachi (JP); Koki Hirano, Hitachinaka (JP); Yoshitake Ageishi, Hitachi (JP); Yuki Haga, Takahagi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/989,632

(22) Filed: Jan. 6, 2016

(65) Prior Publication Data
US 2016/0210824 A1 Jul. 21, 2016

(30) Foreign Application Priority Data
Jan. 16, 2015 (JP) .................................. 2015-006790

(51) Int. Cl.
*H05K 1/02* (2006.01)
*H01R 24/64* (2011.01)

(52) U.S. Cl.
CPC ......... *H05K 1/0298* (2013.01); *H05K 1/0219* (2013.01); *H05K 1/0245* (2013.01); *H01R 24/64* (2013.01); *H05K 2201/09263* (2013.01)

(58) Field of Classification Search
CPC .... G06K 17/00; H05K 1/0298; H05K 1/0228; H05K 1/162; H05K 2201/10189; H05K 2201/0723; H04L 41/26; H04M 1/15; H04M 11/06
See application file for complete search history.

(56) References Cited

U.S. PATENT DOCUMENTS

| | | | | |
|---|---|---|---|---|
| 5,660,568 | A * | 8/1997 | Moshayedi | G06K 19/07743 439/654 |
| 2007/0146941 | A1* | 6/2007 | Harris | H01C 7/12 361/18 |
| 2011/0080918 | A1* | 4/2011 | Robitaille | G06F 1/266 370/401 |
| 2013/0154660 | A1* | 6/2013 | Bucsa | H02H 3/087 324/509 |
| 2014/0241440 | A1* | 8/2014 | Horan | H04L 25/0272 375/257 |

FOREIGN PATENT DOCUMENTS

JP 2010-027437 A 2/2010

* cited by examiner

*Primary Examiner* — Kabir A Timory
(74) *Attorney, Agent, or Firm* — McGinn IP Law Group, PLLC.

(57) ABSTRACT

A repeater includes two connectors each including electrodes and configured to connect a communication cable through which a differential signal is transmitted, a circuit board on which the two connectors are mounted and which includes a signal transmission section configured to connect corresponding electrodes of the two connectors together, and a signal detection circuit mounted on the circuit board and configured to extract a part of a signal transmitted through the signal transmission section and indicate the presence or absence of information communication based on the extracted signal. The circuit board includes a multi-layer substrate including at least an inner layer in which the signal transmission section is formed, two shield layers configured to interpose the signal transmission section therebetween, and an outer layer outside the shield layer on which the signal detection circuit is mounted.

12 Claims, 4 Drawing Sheets

REPEATER

The present application is based on Japanese patent application No. 2015-006790 filed on Jan. 16, 2015, the entire contents of which are incorporated herein by reference.

BACKGROUND OF THE INVENTION

1. Field of the Invention

The present invention relates to a repeater.

2. Description of the Related Art

In a data center and the like, as the layout of information communication devices, such as a server, a hub, and the like, is changed, an information communication device is moved, or an additional information communication device is constructed, connection of communication cables, such as a local area network (LAN) cable, and the like, is changed.

Among known technologies, a technology of checking whether or not a communication cable is physically connected has been known, but a technology of checking whether or not communication is actually performed using a communication cable, that is, the presence or absence of information communication, has not been known up until now. Therefore, there may be cases where a user does not notice that communication is performed and unplugs a communication cable by mistake, and a problem may arise in which a service for an information communication device is stopped and data that is being transferred is damaged.

Then, the present inventors are proposing a repeater on which a signal detection circuit configured to cause a part of a signal that is transferred through a communication cable to diverge to take out the signal, and display, based on the taken-out signal, the presence or absence of information communication.

The repeater herein includes two connectors to each of which a communication cable through which a differential signal is transmitted is connected and a circuit board on which the two connectors are mounted and which includes a signal transmission section configured to connect ones of electrodes (terminals) of the two connectors, which correspond to each other, together, and connects the communication cables together. A signal detection circuit is mounted on the circuit board.

Note that Japanese Unexamined Patent Application Publication No. 2010-27437 discusses related art.

SUMMARY OF THE INVENTION

However, since the signal detection circuit includes an amplifier circuit that amplifies a signal that has been taken out from the signal transmission section and the like, crosstalk and the like, which are caused by the signal detection circuit, may occur, and a problem arises in which there may be cases where a signal transmitted through the signal transmission section is degraded.

There is also a problem in which, as the transmission speed at which a signal is transmitted increases, reflectance loss caused by impedance mismatch in the repeater increases.

It is therefore an object of the present invention to solve the above-described problems and provide a repeater that may display the presence or absence of information communication and may reduce signal degradation due to crosstalk and reflectance loss.

In order to achieve the above-described object, the present invention has been devised and provides a repeater including two connectors each including electrodes, the two connectors configured to connect a communication cable through which a differential signal is transmitted, a circuit board on which the two connectors are mounted, the circuit board including a signal transmission section configured to connect corresponding electrodes of the two connectors together, and a signal detection circuit mounted on the circuit board, the signal detection circuit configured to extract a part of a signal transmitted through the signal transmission section and indicate the presence or absence of information communication based on the extracted signal. The circuit board includes a multi-layer substrate including at least an inner layer in which the signal transmission section is formed, two shield layers configured to interpose the signal transmission section therebetween, and an outer layer outside the shield layer on which the signal detection circuit is mounted.

The two shield layers may be electrically connected to each other via a plurality of through holes formed in an outer edge portion of each of the two layers at predetermined intervals.

The signal detection circuit may be mounted in a position which does not overlap positions on the circuit board, on which the connectors are mounted, when viewed from the top.

The signal detection circuit may include an amplifier circuit configured to extract a part of a signal transmitted through the signal transmission section and amplify the extracted signal, a rectifier circuit configured to rectify the signal amplified by the amplifier circuit to a direct current signal and output the signal, and a display section configured to indicate the presence or absence of information communication based on the signal outputted from the rectifier circuit.

Where the wavelength of the signal transmitted through the signal transmission section is $\lambda$, the signal transmission section may include transmission channels in which the width of each of transmission channels is not less than $3\lambda/10000000$ and not more than $\lambda/1000$, an interval between adjacent ones of the transmission channels is not less than $3\lambda/10000000$ and not more than $3\lambda/1000$, and a channel length of each of the transmission channels is not less than $3\lambda/1000000$ and not more than $\lambda/10$.

The two shield layers may have an interval of not less than $6\lambda/10000000$ and not more than $2\lambda/1000$.

According to the present invention, a repeater that may display the presence or absence of information communication and also may reduce signal degradation due to crosstalk and reflectance loss can be provided.

BRIEF DESCRIPTION OF THE DRAWINGS

FIG. 1A is a perspective view, and FIG. 1B is a cross-sectional view taken along the line 1B-1B.

DESCRIPTION OF THE PREFERRED EMBODIMENTS

An embodiment of the present invention will be described below with reference to the accompanying drawings.

Figure 1A:
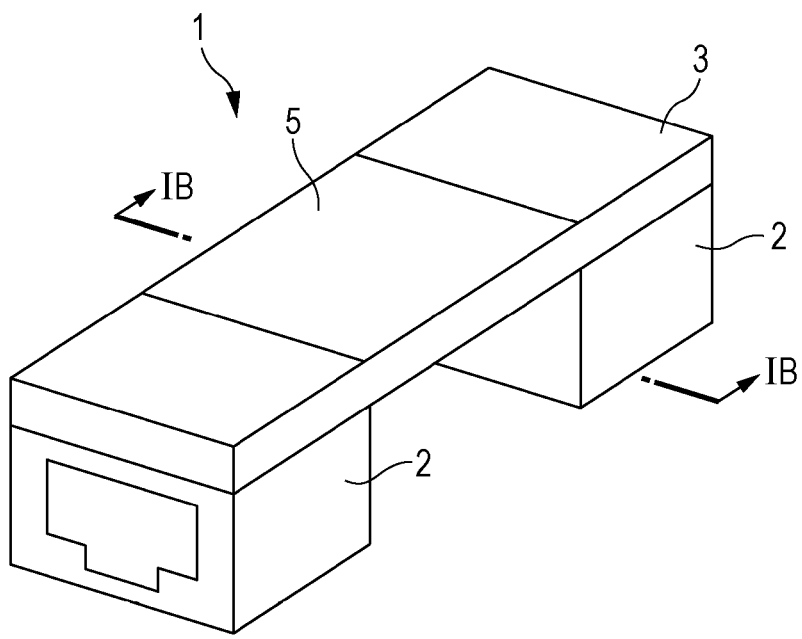
FIGS. 1A and 1B illustrate a repeater according to an embodiment of the present invention.
Figure 1B:
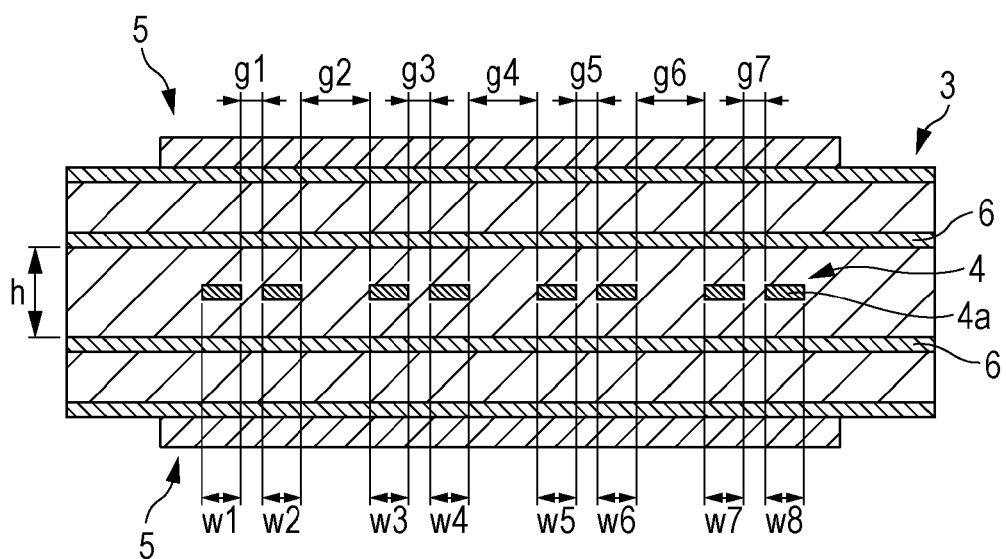
Figure 2:
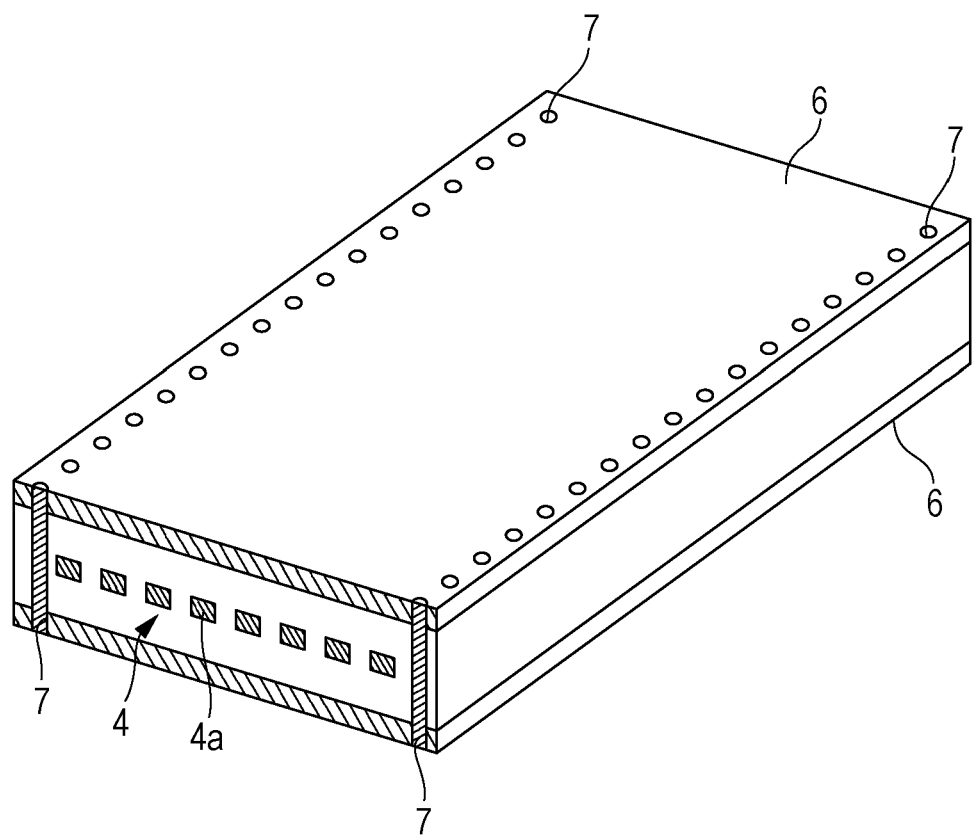
FIG. 2 is a perspective view illustrating only second to fourth layers of a circuit board in the repeater of FIGS. 1A and 1B.

FIGS. 1A and 1B illustrate a repeater according to this embodiment, FIG. 1A is a perspective view, and FIG. 1B is a cross-sectional view taken along the line 1B-1B. FIG. 2 is a perspective view illustrating only second to fourth layers of a circuit board.

As illustrated in FIGS. 1A and 1B and FIG. 2, the repeater 1 includes two connectors 2 to each of which a communication cable (not illustrated) through which a differential signal is transmitted is connected, a circuit board 3 on which the two connectors 2 are mounted and which includes a signal transmission section 4 configured to connect ones of electrodes (terminals) of the two connectors 2, which correspond to each other, together, and a signal detection circuit 5 mounted on the circuit board 3.

Each of the connectors 2 is, for example, a jack connector in compliance with the RJ45 standard, and is configured to be capable of connecting a connector (for example, a plug connector in compliance with the RJ45 standard) provided in an end portion of the corresponding one of the communication cables.

In this embodiment, as the communication cables, communication cables each of which includes four pairs of signal lines through which a differential signal is transmitted are used, and therefore, the signal transmission section 4 including four pairs of transmission channels 4a (eight transmission channels 4a) corresponding to the four pairs of signal lines is formed between the connectors 2.

The signal detection circuit 5 is configured to cause a part of a signal transmitted through the signal transmission section 4 to diverge to take out the signal, and display, based on the taken-out signal, the presence or absence of information communication.

Figure 3:
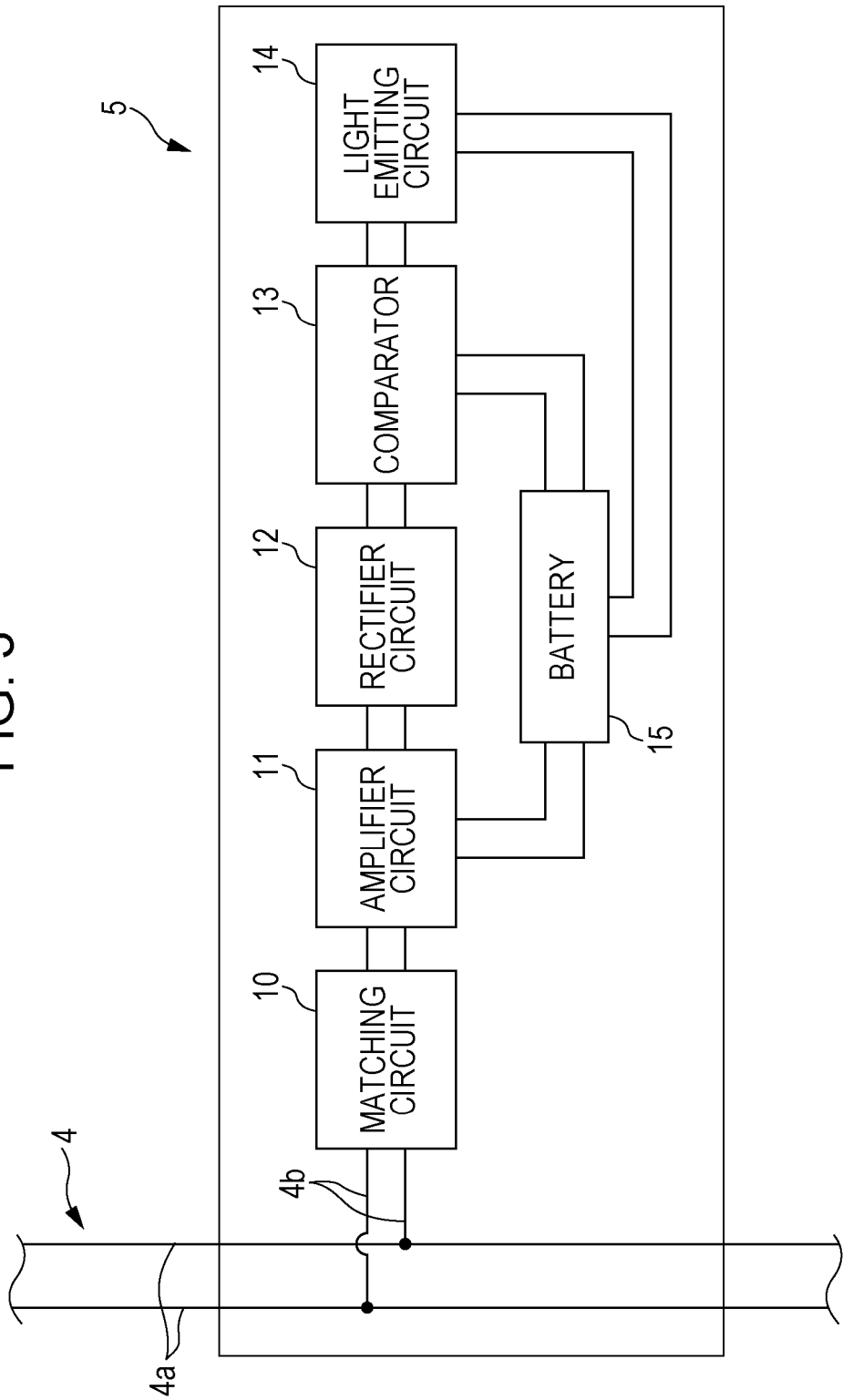
FIG. 3 is a schematic diagram illustrating a configuration of a signal detection circuit used in the repeater of FIGS. 1A and 1B.

More specifically, as illustrated in FIG. 3, the signal detection circuit 5 includes a matching circuit 10, an amplifier circuit 11, a rectifier circuit 12, a comparator 13, and a light emitting circuit 14 that serves as a display section.

The matching circuit 10 performs impedance matching in a predetermined frequency band. In this embodiment, branch transmission channels 4b that diverge from an arbitrary pair of the transmission channels 4a in the signal transmission section 4 are input to the matching circuit 10, and thus, the matching circuit 10 serves also as a function of adjusting the level of a signal that is taken out from the signal transmission section 4 (the communication cable). The matching circuit 10 is, for example, formed of a resistance circuit.

The amplifier circuit 11 is a circuit that amplifies a signal that has been taken out from the signal transmission section 4 via the matching circuit 10 to output the signal to the rectifier circuit 12 in a subsequent stage. As the amplifier circuit 11, for example, a grounded emitter circuit may be used. Note that a specific configuration of the amplifier circuit 11 is not limited thereto. In this embodiment, the amplifier circuit 11 is formed as a single stage configuration, but may be formed as a multi-stage configuration.

The rectifier circuit 12 rectifies an alternate current signal that has been amplified by the amplifier circuit 11 to a direct current signal to output the signal to the comparator 13 in a subsequent stage. As the rectifier circuit 12, a known full-wave rectifier circuit or a known half-wave rectifier circuit may be used.

The comparator 13 is a circuit configured to be turned on when an output voltage of the rectifier circuit 12 is a threshold voltage (an offset voltage), which has been set in advance, or a higher voltage than the threshold voltage, and output a direct current signal having a predetermined voltage to the light emitting circuit 14 in a subsequent stage.

The signal detection circuit 5 includes the comparator 13, and thus, as long as the offset voltage of the comparator 13 is set low, even when an output voltage from the rectifier circuit 12 is low, a signal having a certain voltage may be output to the light emitting circuit 14 and the light emitting circuit 14 may be stably operated. Thus, the level of a signal that is taken out may be lowered by increasing the resistance value of the matching circuit 10, or the like, so that degradation of signal quality of a signal transmitted through a communication cable may be reduced by reducing reflectance loss and insertion loss.

There may be a case where the signal intensity of a signal transmitted through a communication cable differs depending on a communication device to which the communication cable is connected and a case where the signal intensity differs depending on whether the communication cable is long or short. However, the signal detection circuit 5 includes the comparator 13, and thus, even when the signal intensity of a signal transmitted through the communication cable is low, the light emitting circuit 14 may be stably operated. Furthermore, the output voltage from the rectifier circuit 12 may be lowered, and therefore, the output power of the amplifier circuit 11 may be reduced, so that power consumption may be reduced and also degradation of signal quality due to input of an output signal of the amplifier circuit 11 to the communication cable may be reduced.

The light emitting circuit 14 includes a light emitting element, such as a light emitting diode and the like, and is configured to cause the light emitting element to emit light when an output from the comparator 13 is on, that is, when the comparator 13 outputs a signal having a predetermined voltage. Thus, based on whether or not the light emitting circuit 14 is emitting light, the presence or absence of information communication may be determined.

Also, the signal detection circuit 5 includes a battery 15, and supplies power to the amplifier circuit 11, the comparator 13, and the light emitting circuit 14 from the battery 15. Note that the battery 15 may be omitted and power may be externally supplied to the above-described members through a wire or wirelessly.

Returning to FIGS. 1A and 1B and FIG. 2, in the repeater 1 according to this embodiment, the circuit board 3 is formed of a multi-layer substrate including at least four or more layers, the signal transmission section 4 is formed in an inner layer of the circuit board 3, the two-layered shield layer 6 is formed with the signal transmission section 4 interposed between two layers of the shield layer 6, and the signal detection circuit 5 is mounted on an outer layer outside the shield layer 6.

In this embodiment, as the circuit board 3, a five-layered multi-layer substrate is used, the signal transmission section 4 is formed in the third layer, each of the two layers of the shield layer 6 is formed in the corresponding one of the second and fourth layers, and the signal detection circuit 5 is mounted on each of the first and fifth layers that serve as surface layers.

Note that, although, in this embodiment, a five-layered multi-layer substrate is used as the circuit board 3, the present invention is not limited thereto, for example, a multi-layer substrate including six or more layers may be used as the circuit board 3, and, as another alternative, a four-layered multi-layer substrate may be used as the circuit board 3 and the signal transmission section 4 may be formed in only one of front and back surfaces thereof (in this case, the other one of the front and back surfaces is the shield layer 6). As the circuit board 3, for example, a substrate including a resin layer made of glass epoxy resin may be used.

A circuit other than the signal detection circuit 5 may be mounted on the first and fifth layers that serve as surface layers. For example, a correction circuit that corrects crosstalk and reflectance loss that have occurred in the connectors 2 and the like may be mounted on each of the first and fifth layers.

In this embodiment, the eight linear transmission channels 4a are arranged in parallel, thereby forming the signal transmission section 4, but the wiring shape of the transmission channels 4a is not limited thereto.

The shield layer 6 is formed such that a conductive layer, such as a copper foil and the like, is formed substantially in the entire part of each of the second and fourth layers of the circuit board 3. The shield layer 6 is arranged between the signal transmission section 4 and the signal detection circuit 5, and therefore, with the shield layer 6 formed, crosstalk caused by the amplifier circuit 11 and the like may be reduced and signal degradation of a signal transmitted through the signal transmission section 4, which is caused by the signal transmission section 4, may be reduced.

Also, in this embodiment, the two layers of the shield layer 6 are electrically connected to each other via a plurality of through holes (via holes) 7 formed in an outer edge portion of each of the two layers at predetermined intervals. In this case, the through holes 7 are formed along a longitudinal direction of the transmission channels 4a at predetermined intervals at both side portions in an arrangement direction of the transmission channels 4a. With the through holes 7 formed, intrusion of noise from side surfaces of the circuit board 3 may be reduced, and signal degradation of a signal transmitted through the signal transmission section 4 may be reduced.

Also, in this embodiment, the signal detection circuit 5 is mounted in a position which does not overlap positions of the circuit board 3, on which the connectors 2 are mounted, when viewed from the top. This is for reducing influences of noise caused by the signal detection circuit 5 on signals that are transmitted through the connectors 2. In many cases, when the connectors 2 are mounted, in the connectors 2, electrodes (terminals) are exposed, and therefore, it is desired to mount the signal detection circuit 5 in a position as distant from the connectors 2 as possible. Note that, in this embodiment, the shield layer 6 is formed substantially in the entire part of each of the second and fourth layers of the circuit board 3, but the shield layer 6 may be formed at least immediately below the position in which the signal detection circuit 5 is mounted so as to cover the position.

Reduction of reflectance loss in the repeater 1 will be hereinafter described.

As described above, as the signal transmission speed increases, the influence of reflectance loss in the repeater 1 is increased, and thus a problem arises. The present inventors examined, and then, found that, depending on the configuration of the connectors 2, in general, in the connectors 2, reactance changes in a positive direction, and thus, reflectance loss increases.

That is, in the connectors 2, impedance changes to an inductor side. Therefore, the signal transmission section 4 is made capacitive by employing the configuration of this embodiment, so that reflectance loss may be corrected.

More specifically, assuming that the wavelength of a signal transmitted through the signal transmission section 4 is $\lambda$, the signal transmission section 4 is reliably made capacitive by causing each of the widths w1 to w8 of the transmission channels 4a that form the signal transmission section 4 to be not less than $3\lambda/10000000$ and not more than $\lambda/1000$, each of intervals g1 to g7 between the transmission channels 4a to be not less than $3\lambda/10000000$ and not more than $3\lambda/1000$, an interval h between the two layers of the shield layer 6 to be not less than $6\lambda/10000000$ and not more than $2\lambda/1000$, and a channel length of each of the transmission channels 4a to be not less than $3\lambda/1000000$ and not more than $\lambda/10$, so that the signal transmission section 4 may be made capacitive and reflectance loss and insertion loss associated with the reflectance loss may be reduced.

For example, when the frequency of a signal transmitted through the signal transmission section 4 is 1 MHz to 300 MHz, each of the widths w1 to w8 of the transmission channels 4a may be 0.1 mm or more and 1 mm or less, each of the intervals g1 to g7 between adjacent ones of the transmission channels 4a may be 0.1 mm or more and 0.3 mm or less, the interval h between the two layers of the shield layer 6 may be 0.2 mm or more and 2 mm or less, and a channel length of each of the transmission channels 4a may be 1 mm or more and 100 mm or less.

As described above, the repeater 1 according to this embodiment includes the signal detection circuit 5 configured to cause a part of a signal transmitted through the signal transmission section 4 to diverge to take out the signal, and display, based on the taken-out signal, the presence or absence of information communication, the circuit board 3 is formed of a multi-layer substrate including at least four or more layers, the signal transmission section 4 is formed in an inner layer of the circuit board 3, the two-layered shield layer 6 is formed with the signal transmission section 4 interposed between the two layers of the shield layer 6, and the signal detection circuit 5 is mounted on an outer layer outside the shield layer 6.

By configuring the repeater 1 in the above-described manner, the repeater 1 that may display the presence or absence of information communication, reduce crosstalk caused by the signal detection circuit 5 by the shield layer 6, make the signal transmission section 4 capacitive to reduce reflectance loss, and reduce signal degradation may be realized.

Also, in this embodiment, the signal detection circuit 5 includes the amplifier circuit 11 configured to cause a part of a signal transmitted through the signal transmission section 4 to diverge to take out the signal and amplify the taken-out signal to output the signal, the rectifier circuit 12 configured to rectify the signal amplified by the amplifier circuit 11 to a direct current signal to output the signal, and the light emitting circuit 14 that serves as a display section configured to display, based on the output from the rectifier circuit 12, the presence or absence of information communication.

By configuring the signal detection circuit 5 in the above-described manner, while a signal is being transmitted through a communication cable, the light emitting circuit 14 emits light and displays the presence or absence of information communication, so that the occurrence of unplugging of the communication cable by mistake may be reduced. In this embodiment, as the communication cable, a general-purpose cable may be used, thus resulting in reduced cost.

Furthermore, in this embodiment, the signal detection circuit 5 includes the comparator 13, and thus, even when output power of the rectifier circuit 12 is low, the light emitting circuit 14 may be stably operated. As a result, the level of a signal that is taken out from the communication cable may be lowered, and the output power of the amplifier circuit 11 may be lowered, so that degradation of signal quality of a signal transmitted through the communication cable may be reduced.

Needless to say, the present invention is not limited to the above-described embodiment, and various modifications may be made without departing from the gist of the present invention.

Figure 4:
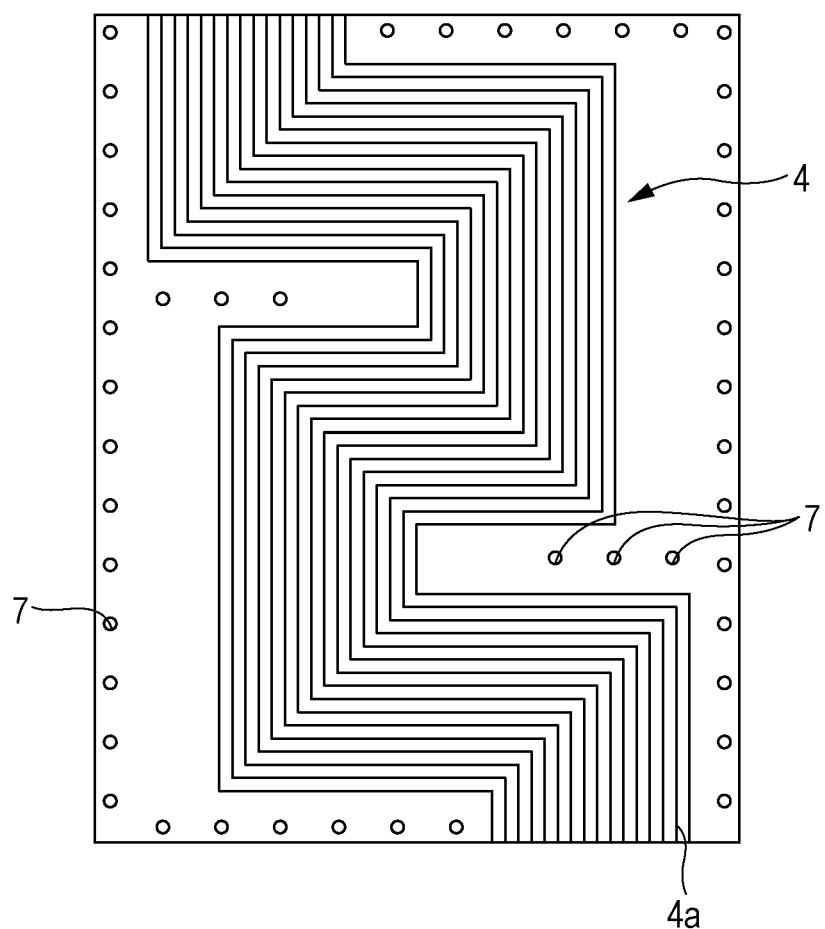
FIG. 4 is a plan view of a signal transmission section in a repeater according to a modified example of the present invention.

For example, although, in the above-described embodiment, a case where the signal transmission section 4 includes the linear transmission channels 4a has been described, the embodiment is not limited thereto and, for example, as illustrated in FIG. 4, the transmission channels 4a may be curved, as appropriate. In this case, it is desired that the through holes 7 are also formed in positions in which the transmission channels 4a are folded back by bending it, that is, between parts of the transmission channels 4a, which are adjacent to each other when the transmission channels 4a are folded back, to reduce the influence of crosstalk.

What is claimed is:

1. A repeater comprising:
   two connectors each comprising electrodes, the two connectors configured to connect a communication cable through which a differential signal is transmitted;
   a circuit board on which the two connectors are mounted, the circuit board comprising a signal transmission section configured to connect corresponding electrodes of the two connectors together; and
   a signal detection circuit mounted on the circuit board, the signal detection circuit configured to extract a part of a signal transmitted through the signal transmission section and indicate a presence or absence of information communication based on the extracted signal,
   wherein the circuit board comprises a multi-layer substrate including at least an inner layer in which the signal transmission section is formed, two shield layers configured to interpose the signal transmission section therebetween, and an outer layer outside a shield layer on which the signal detection circuit is mounted,
   wherein the shield layer is interposed between the electrodes and the signal detection circuit, and
   wherein the signal detection circuit comprises:
      an amplifier circuit configured to extract a part of a signal transmitted through the signal transmission section and amplify the extracted signal;
      a rectifier circuit configured to rectify the signal amplified by the amplifier circuit to a direct current signal and output the signal;
      a display configured to indicate the presence or absence of information communication based on the signal outputted from the rectifier circuit; and
      a comparator configured to turned on when an output voltage of the rectifier circuit is greater than or equal to a threshold voltage and to output a direct current signal predetermined voltage to the display.

2. The repeater according to claim 1, wherein the two shield layers are electrically connected to each other via a plurality of through holes formed in an outer edge portion of each of the two shield layers at predetermined intervals.

3. The repeater according to claim 1, wherein the signal detection circuit is mounted in a position which does not overlap positions on the circuit board, on which the connectors are mounted, when viewed from a top.

4. The repeater according to claim 1, wherein where the wavelength of the signal transmitted through the signal transmission section is $\lambda$, $\lambda$ being an integer equal or greater than 1, the signal transmission section comprises transmission channels in which a width of each of transmission channels is not less than $3\lambda/10000000$ and not more than $\lambda/1000$, an interval between adjacent ones of the transmission channels is not less than $3\lambda/10000000$ and not more than $3\lambda/1000$, and a channel length of each of the transmission channels is not less than $3\lambda/1000000$ and not more than $\lambda/10$.

5. The repeater according to claim 4, wherein the two shield layers have an interval of not less than $6\lambda/10000000$ and not more than $2\lambda/1000$.

6. The repeater according to claim 1, wherein the signal transmission section is formed in an inner layer of the circuit board.

7. The repeater according to claim 1, wherein the signal transmission section is interposed between the two shield layers.

8. The repeater according to claim 1, wherein signal detection circuit is mounted on the outer layer outside the shield layers.

9. The repeater according to claim 1, further comprising a correction circuit that corrects crosstalk and reflectance loss and is mounted on the signal detection circuit.

10. The repeater according to claim 1, wherein the shield layer is formed such that a conductive layer is formed substantially in an entire part of each of two layers of the circuit board.

11. The repeater according to claim 1, wherein the shield layer is arranged between the signal transmission section and the signal detection circuit.

12. A repeater comprising;
   two connectors each comprising electrodes, the two connectors configured to connect a communication cable through which a differential signal is transmitted;
   a circuit board on which the two connectors are mounted the circuit board comprising a signal transmission section configured to connect corresponding electrodes of the two connectors together; and
   a signal detection circuit, mounted on the circuit board, the signal detection circuit configured to extract a part of a signal transmitted through the signal transmission section and indicate a presence or absence of information communication based on the extracted signal,
   wherein the circuit board comprises a multi-layer substrate including at least an inner layer in which the signal transmission section is formed, two shield layers configured to interpose the signal transmission section therebetween and an outer layer outside a shield layer on which the signal detection circuit is mounted,
   wherein the shield layer is interposed between the electrodes and the signal detection circuit,
   wherein the two shield layers are electrically connected to each other via a plurality of through holes formed in an outer edge portion of each of two shield layers at predetermined intervals,
   wherein the signal transmission section comprises transmission channels, and
   wherein the plurality of through holes are formed along a longitudinal direction of the signal transmission section at predetermined intervals at both side portions in an arrangement direction of the transmission channels.

* * * * *